(12) United States Patent
Pedersen et al.

(10) Patent No.: US 7,428,610 B2
(45) Date of Patent: Sep. 23, 2008

(54) WRITING TO FLASH MEMORY

(75) Inventors: Frode Milch Pedersen, Trondheim (NO); Marc Laurent, Nantes (FR)

(73) Assignee: ATMEL Corporation, San Jose, CA (US)

( * ) Notice: Subject to any disclaimer, the term of this patent is extended or adjusted under 35 U.S.C. 154(b) by 253 days.

(21) Appl. No.: 11/353,874

(22) Filed: Feb. 14, 2006

(65) Prior Publication Data
US 2007/0192530 A1   Aug. 16, 2007

(51) Int. Cl.
*G06F 12/00* (2006.01)
(52) U.S. Cl. .................................... 711/103
(58) Field of Classification Search ................ 711/103, 711/117; 365/185.33; 710/52
See application file for complete search history.

(56) References Cited

U.S. PATENT DOCUMENTS

| | | | |
|---|---|---|---|
| 5,974,528 A | 10/1999 | Tsai et al. | |
| 6,421,757 B1 | 7/2002 | Wang et al. | |
| 6,839,285 B2 | 1/2005 | Zink et al. | |
| 6,851,013 B1 | 2/2005 | Larsen et al. | |
| 2004/0190354 A1 | 9/2004 | Shim | |
| 2005/0248990 A1 | 11/2005 | Kessenich | |

FOREIGN PATENT DOCUMENTS

WO   WO 03/104976 A2   12/2003

OTHER PUBLICATIONS

Cypress Semiconductor Corporation, "Using IEEE 1149.1 Boundary Scan (JTAG) With Cypress Ultra37000™ CPLDs," Nov. 18, 1998, 11 pages.
"AVR105: Power Efficient High Endurance Parameter Storage in Flash Memory," Rev. 2546A-AVR-Sep. 2003, 6 pages.
"AVR106: C functions for reading and writing to Flash memory," Rev. 2575A-AVR-Aug. 2004, 10 pages.
"AVR107: Interfacing AVR serial memories," Rev. 2595A-AVR-Mar. 2005, 22 pages.
"AVR108: Setup and Use of the LPM Instruction," Rev. 1233B-AVR-May 2002, 4 pages.
"AVR109: Self Programming," Rev. 1644G-AVR-Jun. 2004, 11 pages.
"AVR910: In-System Programming," Rev. 0943C-Nov. 2000, 10 pages.
"AVR911: AVR Open Source Programmer," Rev. 2568A-AVR-Jul. 2004, 13 pages.
"8-bit AVR® with 8K Bytes In-System Programmable Flash—ATmega8—ATmega8L" 2418O-AVR-Oct. 2004, 305 pages.

*Primary Examiner*—Hiep T Nguyen
(74) *Attorney, Agent, or Firm*—Fish & Richardson P.C.

(57) ABSTRACT

Writing to a page of flash memory may include receiving write commands that are substantially independent of an internal architecture of the flash memory. In certain embodiments, two operand flash commands are received at a flash controller from a remote controller. In various implementations, the writing process may further include translating each two-operand write command into architecture-dependent flash commands; executing the architecture-dependent flash commands to fill a page buffer associated with the flash memory; and subsequently transferring contents of the page buffer to the page of flash memory.

20 Claims, 3 Drawing Sheets

WRITING TO FLASH MEMORY

BACKGROUND

Nonvolatile memory devices generally include an array of MOS transistors, or "cells," having specialized gate structures that are designed to retain digital values, even in the absence of power to the device, by trapping or storing charge. Electronically erasable programmable read-only (EEPROM) memory devices and flash EEPROM devices ("flash") are two examples of nonvolatile memory devices. As used herein, "EEPROM" refers to devices that are generally programmable and erasable at a byte level, while "flash" refers to devices that are generally programmable and erasable in sections larger than one byte.

The memory cells in a flash device are generally arranged in blocks referred to as "pages." Each page may store many bytes of data. For example, a 256 kilobyte (K) flash device may be arranged as 1024 pages where each page stores 256 bytes of data. As another example, a 256K flash device may be arranged as 512 pages, where each page stores 512 bytes of data. Bytes within a page may be individually addressable, or they may be organized as larger words (e.g., 2-byte words, 4-byte words, etc.) The memory cells in a flash device are generally programmed or erased at the page level. That is, data in an entire page may be erased simultaneously, rather than in a byte-by-byte manner. Similarly, an entire page of flash may be programmed simultaneously through the use of a volatile page buffer.

In some conventional flash structures, the volatile page buffer generally has the same capacity as an individual page of nonvolatile flash memory. For example, a flash device that is arranged in 256-byte pages will generally have a 256-byte page buffer. To write data to a flash device, the data may be first written to the page buffer. When the page buffer is filled and a page of flash memory specified, the entire page buffer may be written to the specified page of flash memory. The page buffer may then be erased, refilled and written to another page of flash memory. Because flash memory is generally written one page at a time, data should be written in a manner that is compatible with the internal page structure (number of pages, bytes per page, and word size) of the flash memory.

Flash memory may be included in a stand-alone memory chip, or it may be embedded in a chip that provides functions beyond just storing data. For example, flash memory may be included in a microcontroller having a processing unit, registers, embedded memory, peripherals and various interface ports. Either a stand-alone flash memory chip or a device having embedded flash memory may be part of a larger circuit that includes, for example, a printed circuit board (PCB) and various other electrical components. A flash memory die may also be included in a package with other dies that make up a "system on a chip" (SOC).

SUMMARY

Writing to a page of flash memory may include receiving write commands that are substantially independent of an internal architecture of the flash memory. In certain implementations, multi-operand (e.g., two-operand) flash commands are received at a flash controller from a remote controller. In various implementations, the writing process may further include translating each multi-operand write command into architecture-dependent flash commands; executing the architecture-dependent flash commands to fill a page buffer associated with the flash memory; and subsequently transferring contents of the page buffer to the page of flash memory.

In one implementation, a method of writing to a page of flash memory that is arranged to contain a first number of logical data units may include (a) receiving at a local controller from a remote controller via an interconnection means (e.g., a bus), a write command that includes one logical data unit and an address; (b) translating, by the local controller, the write command to a plurality of flash memory commands; and (c) executing the flash memory commands to transfer the logical data unit to a page buffer within the flash memory. Actions (a)-(c) may be repeated a number of times equal to the first number, in order to fill the page buffer; and the contents of the page buffer are transferred to the page of flash memory.

In some implementations, the bus is a serial bus. The serial bus may be a test interface that is compliant with IEEE (Institute of Electrical and Electronics Engineers) standard 1149.1 or 1149.1a. In some implementations, the bus is a programming interface, and the remote controller is a dedicated device programmer.

In some implementations, the flash memory and the local controller are embedded in a microcontroller device. The remote controller may be external to the microcontroller device. The logical data unit may include one byte of data or one word of data; one word of data may include a plurality of bytes of data.

Translating the write command may include generating a page buffer address that corresponds to the address of the write command. The method may further include calculating a page address corresponding to the page of flash memory. Calculating the page address may include calculating the page address based on at least one address received in action (a).

In another implementation, a method of writing to a page of embedded flash memory may include (a) receiving at an embedded flash programming unit, via a bus and from a controller remote from the embedded flash programming unit, a multi-operand (e.g., two operand) write command. The multi-operand write command may have a first operand that specifies an address and a second operand that specifies a data unit. The method may further include (b) translating the multi-operand write command into a plurality of flash commands; (c) repeating (a)-(b) for a number of multi-operand write commands corresponding to a number of data units in a page buffer; (d) executing the flash commands to fill the page buffer; and (e) upon filling the page buffer, writing contents of the page buffer to the page of embedded flash memory.

The method may further include suspending the execution of the plurality of commands to fill the page buffer while writing contents of the page buffer to the page of flash memory. Suspending the execution of the plurality of commands may include suspending the translation of the multi-operand write command into the plurality of commands. Suspending the execution of the plurality of commands may include suspending the receipt of the multi-operand write command. The method may further include generating a halt signal to prevent the controller from transmitting, via the bus, the multi-operand write command to the embedded flash programming unit.

In another implementation, a system for storing data may include a flash memory arranged in a plurality of pages and having a page buffer, each page of the plurality of pages storing a first number of logical data units, the page buffer also storing the first number of logical data units. The system may also include a flash programming unit. The flash programming unit may include an interface that connects, via a bus, to a controller remote from the flash programming unit and that receives multi-operand (e.g. two-operand) write commands from the controller. Each multi-operand write command can have a first operand specifying an address and a second operand specifying at least a portion of a logical data unit. The flash programming unit further includes a translation unit that translates each multi-operand write command to a plurality of flash commands. The plurality of flash commands may cause at least the portion to be written to the page buffer. The flash programming unit may further include a controller that causes contents of the page buffer to be written to a page of the plurality of pages when the page buffer has been written with the first number of logical data units.

The system may further include a microcontroller, and the microcontroller may include the flash memory and the flash programming unit. The controller may be external to the microcontroller. The interface may suspend receipt of the multi-operand write commands while the page buffer is written to the page of the plurality of pages.

Advantages of the systems and techniques described herein may include any or all of the following. A flash programming device may program flash memory with fewer commands. A flash programming device may program flash memory with simpler commands. A flash programming operation may be faster. Flash memory may be programmed by commands that are independent of an internal architecture of the flash memory.

The general and specific aspects may be implemented using a system, a method, or a computer program, or any combination of systems, methods, and computer programs. The details of one or more embodiments are set forth in the accompanying drawings and the description below.

DESCRIPTION OF DRAWINGS

These and other aspects will now be described in detail with reference to the following drawings.

Like reference symbols in the various drawings indicate like elements.

DETAILED DESCRIPTION OF EXEMPLARY EMBODIMENTS

Writing to a page of flash memory may include receiving, at a flash controller, from a remote controller, multi-operand (e.g., two-operand) write commands that are substantially independent of an internal architecture of the flash memory; translating each multi-operand write command into architecture-dependent flash commands; executing the architecture-dependent flash commands to fill a page buffer associated with the flash memory; and subsequently transferring contents of the page buffer to the page of flash memory. Reference will be made to a system that processes two-operand write commands, though those of ordinary skill in the art will recognize that other multi-operand configurations are possible.

Figure 1:
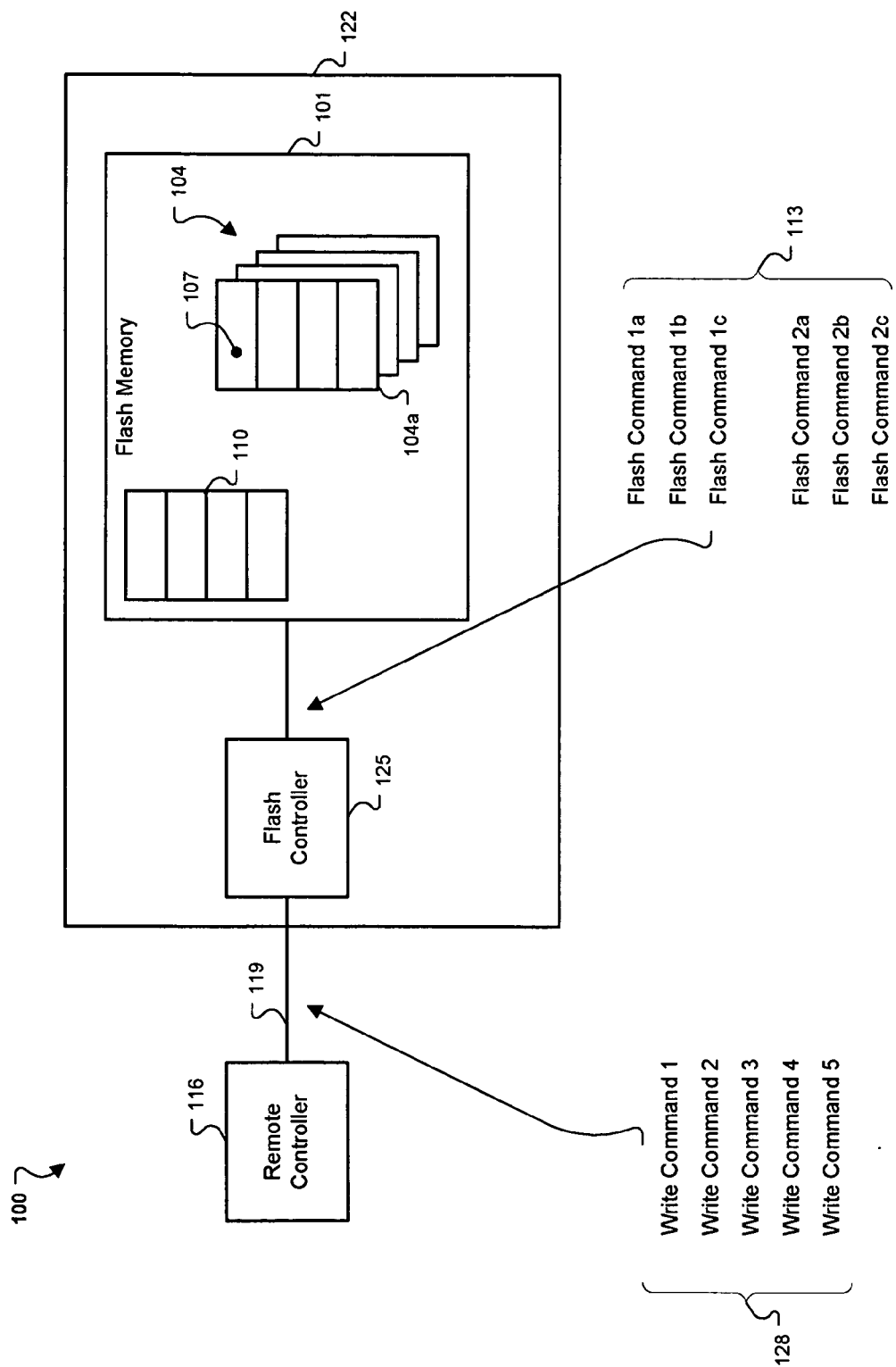
FIG. 1 is a block diagram of a system in which multi-operand (e.g., two-operand) write commands may be translated to flash commands.

FIG. 1 is a block diagram illustrating a system 100 in which a page of flash memory may be written by translating a series of two-operand write commands to flash commands. The system 100 includes flash memory 101, which is arranged in a number of pages 104. Each page stores a number of bytes of data. The bytes may be individually addressable, or they may be grouped in other logical data units. For example, each page may be arranged as a number of individually addressable words, and each word 107 may include a number of bytes (e.g., 2 bytes, 4 bytes, 8 bytes, etc.). As shown, each of the pages 104 includes four words. The flash memory 101 also includes a page buffer 110, which in one implementation is the same size as one of the pages 104 of the flash memory 101; that is, the page buffer 110 stores the same number of bytes as one of the pages 104 stores.

As is described in further detail with reference to FIG. 2, writing data to a page of flash memory generally involves first writing the data to the page buffer 110. When the page buffer 110 is full, its contents may be transferred to a specific page 104a of flash memory 101. To write data to all of the pages 104 of the flash memory 101, the page buffer 110 is generally filled once for each page 104 of memory, its contents are transferred to a specific page of flash memory, the page buffer 110 is erased or cleared, the page buffer 110 is again filled, its contents are transferred to another page of flash memory in sequence, and so on.

Filling the page buffer 110, transferring its contents to a specific page 104a of flash memory 101, erasing the page buffer 110, and performing other operations in the flash memory generally require specialized flash commands 113 (hereinafter "flash commands 113"). These specialized flash commands 113 are generally based on an internal architecture of the flash memory 101. For example, in order for a device, such as a remote controller 116, to write data to the flash memory 101, the remote controller 116 may initially clear the page buffer 110 with a specialized flash command, then write data to each word in the page buffer 110 with other specialized flash commands. To properly fill the page buffer 110, the remote controller 116 may account for the size, in bytes, of the page buffer 110; and the width of a bus 119 coupling the remote controller 116 to the flash memory 101. For example, to fill a 32-byte page buffer over a 16-bit bus, the remote controller 116 may transfer 16 two-byte words to the flash memory. After the 16 two-byte words have been transferred to the 32-byte page buffer, the remote controller may cause the page buffer contents to be written to a specific page of flash memory. To properly transfer contents of the page buffer 110 to a page 104a of flash memory 101, the remote controller 116 may also account for the number of pages 104 in the flash memory 101 and the overall capacity of the flash memory 101. For example, to properly fill a number of pages 104 of flash memory 101 in sequence, the remote controller 116 may account for how the pages 104 are addressed, which may, in turn, depend on the overall capacity of the flash memory 101 and of the size of the pages 104.

In some implementations, the remote controller 116 may be a dedicated flash programmer, and flash memory 101 may be a stand-alone memory device. In some implementations, the flash memory 101 may be flash memory that is embedded in another device 122, such as a microcontroller. In some implementations, the remote controller 116 may be a microprocessor or memory controller that accesses the flash memory 101. The bus 119 may be a parallel bus that can couple the flash memory 101 to the remote controller 116. For example, the bus 119 may be a parallel system bus that couples the flash memory 101 to other devices within a datapath. The bus 119 may also be a serial bus. For example, the bus 119 may be a dedicated serial communication or programming interface, such as an Inter Integrated Circuit ($I^2C$)

bus, or a Serial Peripheral Interface (SPI) bus. As another example, the bus 119 may be part of a test interface, such as a boundary scan interface that complies with IEEE (Institute of Electrical and Electronics Engineers) Standard 1149.1 or 1149.1a (sometimes referred to as a "JTAG" interface, which was developed by the Joint Test Action Group). In some implementations, the bus 119 (e.g., a JTAG interface) may be used to program devices connected to it, such as the flash memory device 101.

As shown in FIG. 1, the system 100 also includes a flash controller 125 that is interposed between the flash memory 101 and the remote controller 116. In some implementations, the flash controller 125 may be used to translate simple, flash-architecture independent write or store commands (hereinafter "commands 128") into architecture-dependent flash commands 113. Including such a flash controller 125 in the system 100 may enable the remote controller 116 to interact with the flash memory 101 in a flash-architecture independent manner, and the commands 128 necessary to write data to the flash memory may be fewer and simpler. For example, instead of providing "Flash Command 1A," "Flash Command 1B," and "Flash Command 1C" to the flash memory 101 in order to write, e.g., a single word to the page buffer 110, the remote controller 116 may instead provide a single "Write Command 1." The flash controller 125 may translate the "Write Command 1" into, for example, "Flash Command 1A," "Flash Command 1B" and "Flash Command 1C," and provide the translated commands to the flash memory 101.

The commands 128 may be completely independent of internal architecture details of the flash memory 101. For example, the commands 128 may be a series of two-operand write commands specifying data units to be sequentially written to the flash memory 101. Each command 128 may specify data to be written and a sequential address to which the data should be written. The address may be independent of page addresses, page buffer addresses, or the page buffer 110 itself. That is, the flash controller 125 may translate, for example, an "absolute" address to an appropriate page buffer address; moreover, after an appropriate number of data units have been received by the flash controller 125 and written to the page buffer 110, the flash controller 125 may issue commands for transferring the contents of the page buffer 110 to an appropriate page 104*a*. Furthermore, the flash controller 125 may interject flash command(s) 113 to erase the page buffer 110 before continuing to receive additional data units from the remote controller 116 to be written to the flash memory 101.

In some implementations, the flash controller 125 may automatically prevent the remote controller 116 from sending more data units while the contents of the page buffer 110 are being transferred to a page 104*a* of flash memory 101. For example, the flash controller 125 may generate a busy or halt signal (not shown) that temporarily prevents the remote controller 116 from sending more data units to be written. In some implementations, the flash controller 125 may continuously receive commands from the remote controller 116, and the flash controller 125 may temporarily buffer them (buffer not shown), or temporarily hold off translating them into flash commands 113, while the contents of the page buffer 110 are being written to a page 104*a* in the flash memory 101. The process of translating two-operand commands 128 to flash commands 113 is now described with reference to FIG. 2.

Figure 2:
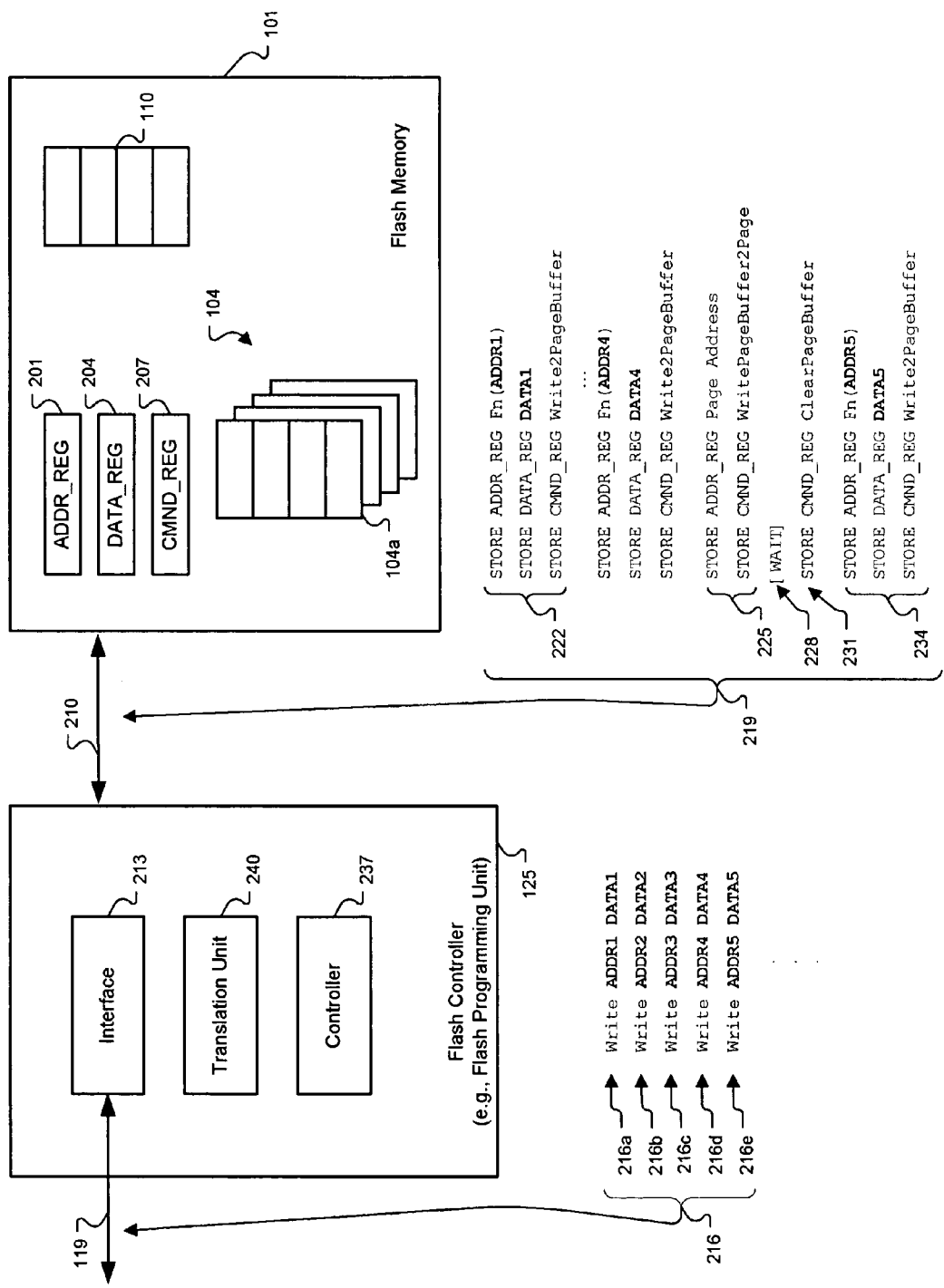
FIG. 2 is a block diagram showing additional details of the flash memory and flash controller that are shown in FIG. 1.

FIG. 2 is a block diagram illustrating additional details of the flash memory 101 and the flash controller 125 that are shown in FIG. 1. As described above, flash memory 101 is generally arranged in "pages." As shown in FIG. 2, the flash memory 101 has four pages 104, and each page has four words. FIG. 2 is simplified for the purposes of illustration. An actual flash device would generally have more pages, and each page would have more words. For example, a typical flash memory may be arranged as 512 pages, where each page stores 512 bytes of data.

In addition, the flash memory 101 has a page buffer 110 that is used to write data to the flash pages 104. The page buffer 110 can have the same capacity as an individual page of the flash memory 101, such that the page buffer 110 may fill one page of flash memory. Data can be first written to the page buffer, and the contents of the page buffer are then transferred to a particular page.

The page buffer 110 may be indirectly accessed through registers. For example, the flash memory 101 may include an address register 201, a data register 204 and a command register 207. Writing a word to the page buffer 110 may involve writing a value to the address register 201 that specifies the word address within the page buffer 110, writing a data value to the data register 204, and writing a command that causes a state machine (not shown) within the flash memory 101 to transfer the contents of the data register 204 to the word in the page buffer 110 corresponding to the contents of the address register 201. This process may be repeated for each word in the page buffer 110, and when the page buffer 110 is full, it may be transferred to a page of memory. To transfer the page buffer 110 to a page of memory, an address of the page may be written to the address register 201, and a command may be written to the command register 207. The command may specify that the page buffer 110 is to be transferred to a page having an address that corresponds to the contents of the address register 201.

The flash memory 101 may perform other operations in response to various other commands. For example, writing certain values to the address register 201 and command register 207 may cause the page buffer 110 to be erased. In response to other commands, individual pages may be erased, the entire device may be erased, values may be read, or other operations may be performed.

In some implementations, a word may be a single byte, and in some implementations, a word may be two or more bytes. The size of the registers 201, 204 and 207 may vary accordingly, and may further vary based on the width of a data bus 210 through which the embedded flash memory is accessed. For example, in implementations with two-byte words and a one-byte bus, the data register may each actually be two registers—a "high" register and a "low" register—and writing data to a page of memory may include additional cycles not described above.

Various features of an example flash controller 125 are now described. The flash controller 125 may be used to translate architecture-independent commands (e.g., two-operand write commands) to architecture-dependent flash commands. To translate architecture-independent commands, the flash controller may include an interface 213 that receives such commands. The interface 213 may include a register that is coupled to the bus 119. Via the bus 119, the interface 213 may receive the commands from a remote controller 116 (shown in FIG. 1), such as, for example, a dedicated flash programmer.

The commands received by the interface 213 via the bus 119 (e.g., commands 216) are generally independent of internal architecture of the flash memory 101. In particular, example commands 216 do not specify addresses within the page buffer 110 or flash pages; rather, the commands 216 may specify data corresponding to an "absolute" address that is within a range of addresses mapped to the flash memory. (As used herein, "absolute" is relative to the base address of the flash memory, rather than being relative to pages in the flash memory or relative to the page buffer.)

The flash controller 125, may translate the commands 216 into architecture-dependent flash commands (e.g., the commands 219). As an example, the flash controller 125 may translate the command 216*a* ("write ADDR1 DATA1") into appropriate flash commands for writing the value DATA1 to an appropriate word in the page buffer 110. The word in the page buffer 110 may be determined by applying some function to the ADDR1 value (depicted as "Fn(ADDR1)" in FIG. 2). For example, in some implementations, the lower bits of an address value may be used to identify a word within the page buffer 110, and higher bits of the address value may be discarded or subsequently used to identify a page within the flash memory. In particular, the DATA1 value may be written to the data register 204; the address value—possibly modified by an appropriate function—may be stored in the address register 201; and a command may be stored in a command register 207. The command may cause the data in the data register 204 to be stored in a page buffer word that is addressed by the contents of the address register 201. Thus, in some implementations, the three register writes 222 may be architecture-dependent flash commands corresponding to architecture-independent command 216*a*.

The flash controller 125 may receive a sufficient number of architecture-independent commands 216 to fill the page buffer 110. For example, the flash controller may receive commands 216*b*, 216*c* and 216*d* and translate each of these commands into architecture-dependent flash commands in the manner described above. Once the page buffer 110 has been filled, the flash controller 125 may issue additional flash commands 225 that specify a page address and cause the contents of the page buffer 110 to be transferred to the specified page. More particularly, the flash controller may write a page address to the address register 201 and a command to the command register 207 that causes the contents of the page buffer 110 to be transferred to a page whose address is specified by the contents of the address register 201.

The process of writing the contents of the page buffer 110 to one of the pages 104 may take some amount of time, during which certain flash operations may be suspended. That is, the flash memory 101 or the flash controller 125 may enforce "wait states," as depicted by the wait command 228, through use of a buffer or a "halt," "suspend," "busy," or similar-functioning signal. In some implementations, wait states may be enforced by transmitting a suspend signal to the bus 119 to temporarily prevent the remote controller 116 from sending additional commands 216; in some implementations, the flash controller may continue to receive commands 216 via the bus 119, but the flash controller 125 may temporarily suspend translating the commands 216 to flash commands 219; in some implementations, the flash controller 125 may receive commands 216 and translate them, but the flash controller 125 may temporarily hold off issuing them to the flash memory 101 while the page buffer 110 is being transferred to one of the pages 104.

After the contents of the page buffer 110 have been transferred to one of the pages 104, the flash controller 125 may cause the page buffer 110 to be cleared, for example, by using a "ClearPageBuffer" command 231. After the page buffer 110 has been cleared, the flash controller 125 may resume translating commands 216 to flash commands 219. As shown, the commands 234 correspond to the command 216*e*.

To control the overall process of translating architecture-independent commands 216 to architecture-dependent flash commands 219, the flash controller 125 may employ a controller 237 and a translation unit 240. The controller 237 (e.g., a finite state machine) may control the overall operations of the flash controller. For example, the controller 237 may track the receipt of commands 216 relative to the internal architecture of the flash memory 101. More particularly, the controller 237 may manage the number of commands 216 to fill the page buffer 110 before transferring the contents of the page buffer 110 to one of the pages 104 (e.g., with the flash commands 225). The controller 237 may also track the pages 104 in order to sequentially fill the flash memory 101 with data.

The flash controller 125 also includes a translation unit 240. The translation unit 240 may, under the control of the controller 237, translate the commands 216 to flash commands 219. The translation process may involve parsing the incoming commands 216 into data and address components, translating the data component into a write-to-the-data-register-204 command, and translating the address component into a write-to-the-address-register-201 command. Translating the address component may require certain processing. For example, the command 216*a* ("Write ADDR1 DATA1") includes the address component "ADDR1," but its corresponding flash command may have a "Fn(ADDR1)" component that represents a function applied to the ADDR1 value. More particularly, the function may extract a portion of the ADDR1 value. As described above, lower bits of the ADDR1 value may be used to index a word within the page buffer 110, while higher bits of the ADDR1 value may be used to index one of the pages 104.

In addition to merely mapping address and data components (or portions thereof) from commands 216 to flash commands 219, the translation unit 240 may perform additional processing. For example, in some implementations, the translation unit 240 may apply an algorithm in order to scramble or encrypt either or both of the data or address components. As a more specific example, the translation unit 240 may translate ADDR1 to Fn(ADDR1), where Fn(ADDR1) represents an encrypted or scrambled address value. Such encryption or scrambling may be used, for example, to protect the data from unauthorized access or to protect a portion of the system against hacking or reverse-engineering. Similar translations may be applied data.

Figure 3:
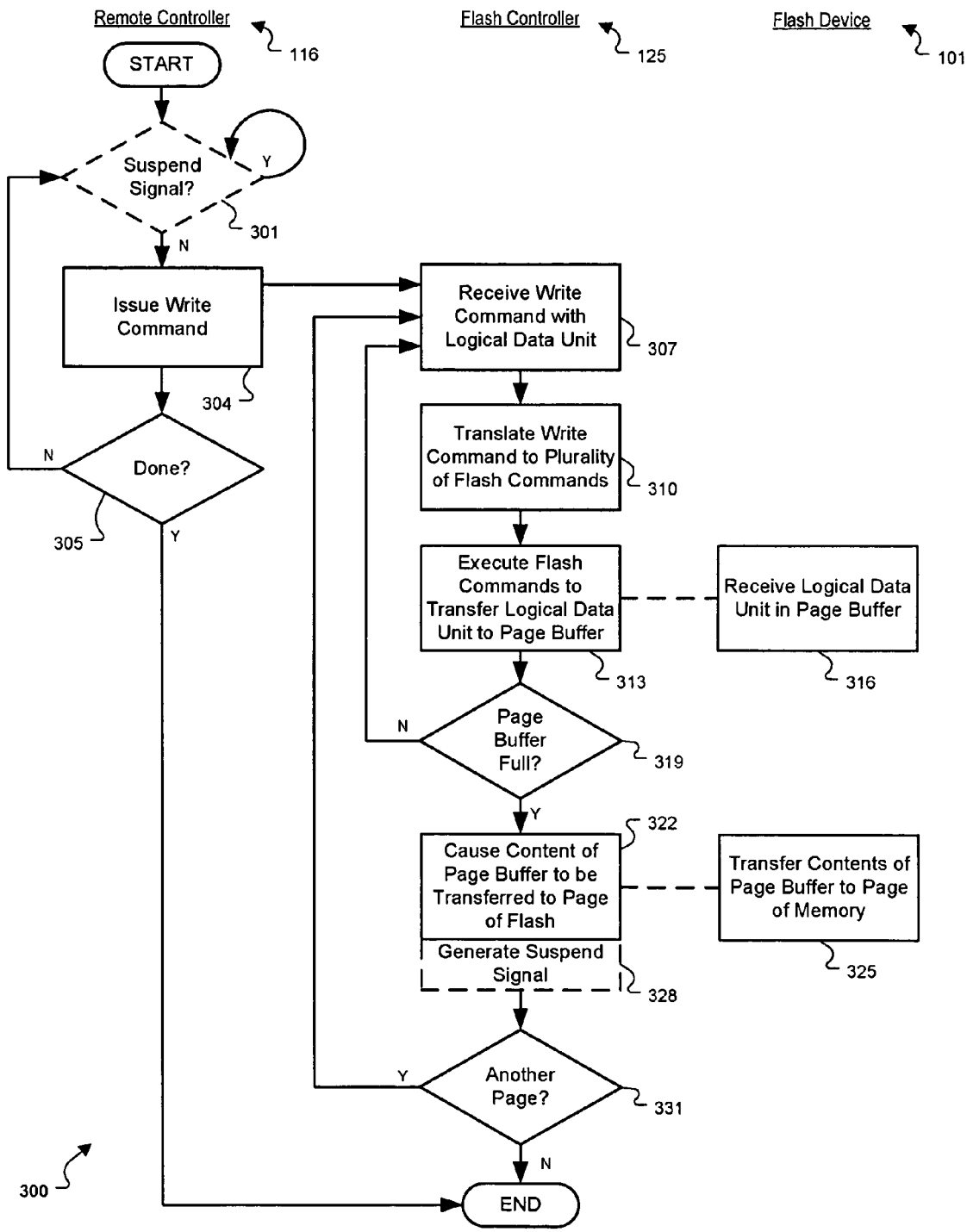
FIG. 3 is a flow diagram illustrating a method for translating multi-operand write commands to flash commands, and executing the flash commands to write to flash memory.

FIG. 3 is a flow diagram that further illustrates a method 300 for translating architecture-independent commands to architecture-dependent flash commands. The method 300 is illustrated with reference to three devices that are shown in FIG. 1: the remote controller 116, the local controller 125 and the flash memory device 101.

The method 300 may determine whether writes to the flash controller (e.g., a "local controller") have been suspended (301). For example, if the page buffer 110 is currently being written to one of the pages 104 of the flash memory 101, further writes by the remote controller 116 may be temporarily suspended. In some implementations, this determination 301 is not made; rather write commands issued by the remote controller 116 may be buffered and translation of the commands may be suspended. In some implementations, commands may be translated, but the translated flash commands may be buffered and not issued to the flash memory while the contents of the page buffer 110 are being written to one of the pages 104.

Absent an optional suspend signal (301), the remote controller 116 issues (304) a write command to the flash controller. For example, the remote controller 116 may issue a two-operand command specifying only an "absolute" address and a data value to be written to the flash memory 101. The two-operand write command may be independent of internal architecture of the flash memory, and the two-operand write command may be issued to the flash controller 125 via the bus 119. The remote controller 116 may determine (305) whether another write is to be issued, and if so, the remote controller 116 may issue repeated write commands.

The flash controller receives (307) a write command. As described above, the received write command may include a data value, or logical data unit. In some implementations, the logical data unit may include one byte of data. In some implementations, the logical data unit may be a word that includes more than one byte of data. The size of the logical data unit may be based on the width of the bus 119 and the format of the write command. For example, a write command that is formatted to be completely transferred in a single bus cycle over a 16-bit bus may include a 4-bit operation code (opcode), a 4-bit address value, and eight bits (one byte) of immediate data content; in this case, the logical data unit may be one byte. As another example, a write command may be formatted to be completely transferred in two bus cycles over a 16-bit bus, and the write command may include an 8-bit opcode, 8 bits of address information, and two bytes of immediate data content; in this case, the logical data unit may be two bytes. As another example, a write command may be formatted to be completely transferred in 24 bus cycles over a single-bit serial bus, and the write command may include a four-bit opcode, four bits of address information, and two bytes of immediate data content; in this case, the logical data unit may also be two bytes.

The size of the logical data unit may also be based on the format of the data itself. In some implementations, the logical data unit may include one or more units of data as well as one or more bits of control or check information. For example, a logical data unit may include 7 bits of data and one bit of parity. As another example, a logical data unit may be formatted to support error checking and correction (ECC) and may, accordingly, include, e.g., 4 bytes of data and 1 byte of ECC information to allow the integrity of the data to be verified or maintained. Some logical data units may also include data and corresponding header or wrapper information, which may be used to route the data over various buses or networks external to the flash memory 101.

The flash controller 125 translates (310) the write command into a plurality of flash commands. For example, referring to FIG. 2, the flash controller 125 may translate the command 216a ("Write ADDR1 DATA1") into the flash commands 222 ("STORE ADDR_REG Fn(ADDR1)," "STORE DATA_REG DATA1" and "STORE CMND_REG Write2PageBuffer").

The flash commands may be executed (313) to transfer the logical data unit to the page buffer 110. That is, the commands 222 may be issued by the flash controller 125 to the flash device 101, via the bus 210. The commands 222 may be executed (313) such that, for example, appropriate values are written to the registers 201, 204 and 207.

Upon receipt of appropriate values in the registers 201, 204 and 207, a state machine (not shown) in the flash memory 101 may cause the logical data unit to be received (316) in the page buffer 110. Based on the size of the data register 204, more operations may be required than are described above. For example, to receive a two-byte logical data unit over an 8-bit bus 210, two data writes may be required, and the data register 204 may actually include a "data low" register and a "data high" register. A single data register 204 is shown for purposes of illustration only, and the exact architecture of the flash memory 101 is not critical to the systems, methods and apparatus described herein.

The flash controller 125 determines (319) whether the page buffer 110 is full. For example, the controller 237 within the flash controller 125 may track a number of logical data units that have been transferred to the page buffer 110. If the page buffer 110 has not been filled, the flash controller 125 may receive (307) another write command, translate (310) the write command to a plurality of flash commands, and execute (313) the flash commands to transfer another logical data unit to the page buffer 110.

If the page buffer is determined (319) to be full, the flash controller 125 may cause its contents to be transferred (322) to one of the pages 104 of flash memory 101. For example, referring to FIG. 2, the flash controller 125 may issue flash commands 225 to specify a page address and cause the content of the page buffer 110 to be transferred to a page corresponding to the specified page address.

In response, the flash memory 101, under the control of an internal state machine (not shown), may transfer (325) the contents of the page buffer 110 to one of the pages 104 of the flash memory 101. As described above, this transfer may take some time, during which a suspend signal may be generated (328), or part of the above-described process may otherwise be temporarily halted or suspended.

Upon completion of the transfer 325, the flash controller 125 may determine (331) whether to write another page of data to the flash memory 101. If another page is to be written, the flash controller 125 may receive (307) additional write commands, translate (301) them, and execute (313) them to fill the page buffer 110 again. Between sequences of filling the page buffer 110, the flash controller 125 may clear the contents of the page buffer 110, for example, by issuing the command 231.

In some instances, the remote controller 116 may only provide enough write commands to partially fill the page buffer 110. In such instances, the flash controller 125 may generate additional flash commands with "filler" logical data units, in order to transfer the actually provided logical data units to the flash memory 101. Alternatively, the flash controller 125 may simply issue a command to cause the partially filled page buffer 110 to be transferred to a page in its partially filled state, without generating and writing "filler" logical data units to the page buffer 110.

Implementations may be implemented, at least in part, in hardware or software or in any combination thereof. Hardware may include, for example, analog, digital or mixed-signal circuitry, including discrete components, integrated circuits (ICs), or application-specific ICs (ASICs). Implementations may also be embodied, in whole or in part, in software, firmware or microcode, which may cooperate with hardware. Processors for executing instructions may retrieve instructions from a data storage medium, such as EPROM, EEPROM, NVRAM, ROM, RAM, a CD-ROM, a HDD, and the like. Computer program products may include storage media that contain program instructions for implementing embodiments described herein.

A number of embodiments have been described. Nevertheless, it will be understood that various modifications may be made without departing from the spirit and scope of this disclosure. Accordingly, other embodiments are within the scope of the following claims

What is claimed is:

1. A method of writing to a page of flash memory that is arranged to contain a first number of logical data units, the method comprising:
   (a) receiving at a local controller from a remote controller via a bus, a write command comprising one logical data unit and an address;
   (b) translating the write command to a plurality of flash memory commands;

(c) executing the flash memory commands to transfer the one logical data unit to a page buffer within the flash memory;

(d) executing (a)-(c) a number of times equal to a first number, in order to fill the page buffer; and (e) causing contents of the page buffer to be transferred to the page of flash memory.

2. The method of claim 1, where the bus is a serial bus.

3. The method of claim 2, where the serial bus is a test interface that is compliant with IEEE (Institute of Electrical and Electronics Engineers) standard 1149.1 or 1149.1a.

4. The method of claim 1, where the bus is a programming interface, and the remote controller is a dedicated device programmer.

5. The method of claim 1, where the flash memory and the local controller are embedded in a microcontroller device.

6. The method of claim 5, where the remote controller is external to microcontroller device.

7. The method of claim 1, where the logical data unit comprises one byte of data or one word of data, the one word comprising a plurality of bytes of data.

8. The method of claim 1, where translating the write command comprises generating a page buffer address that corresponds to the address.

9. The method of claim 1, further comprising calculating a page address corresponding to the page of flash memory.

10. The method of claim 9, where calculating the page address comprises calculating the page address based on at least one address received in (a).

11. A method of writing to a page of embedded flash memory comprising:

(a) receiving at an embedded flash programming unit, via a bus and from a controller remote from the embedded flash programming unit, a two-operand write command, the two-operand write command having a first operand specifying an address and a second operand specifying a data unit;

(b) translating the two-operand write command into a plurality of flash commands;

(c) executing (a)-(b) for a number of two-operand write commands corresponding to a number of data units in a page buffer;

(d) executing the flash commands to fill the page buffer; and (e) upon filling the page buffer, writing contents of the page buffer to the page of embedded flash memory.

12. The method of claim 11, further comprising suspending executing the plurality of commands to fill the page buffer while writing contents of the page buffer to the page of flash memory.

13. The method of claim 12, wherein suspending executing the plurality of commands comprises suspending translating the two-operand write command into the plurality of commands.

14. The method of claim 12, wherein suspending executing the plurality of commands comprises suspending receiving the two-operand write command.

15. The method of claim 14, further comprising generating a halt signal to prevent the controller from transmitting, via the bus, the two-operand write command to the embedded flash programming unit.

16. A system for storing data comprising:

a flash memory being arranged in a plurality of pages and having a page buffer, each page of the plurality of pages storing a first number of logical data units, the page buffer also storing the first number of logical data units; and a flash programming unit comprising:

an interface operable for coupling to a controller remote from the flash programming unit and operable to receive two-operand write commands from the controller, each two-operand write command having a first operand specifying an address and a second operand specifying at least a portion of a logical data unit;

a translation unit that translates each two-operand write command to a plurality of flash commands, the plurality of flash commands causing the at least a portion of a logical data unit to be written to the page buffer; and a flash memory controller to initiate the writing of the contents of the page buffer to a page of the plurality of pages when the page buffer has been written with the first number of logical data units.

17. The system of claim 16, wherein the logical data unit comprises one byte of data or one word of data, the one word comprising a plurality of bytes of data.

18. The system of claim 16, further comprising a microcontroller, wherein the microcontroller comprises the flash memory and the flash programming unit.

19. The system of claim 18, wherein the controller is external to the microcontroller.

20. The system of claim 16, wherein the interface suspends receiving the two-operand write commands while the page buffer is written to the page of the plurality of pages.

* * * * *